United States Patent
Saitou

(10) Patent No.: US 9,753,340 B2
(45) Date of Patent: Sep. 5, 2017

(54) DISPLAY DEVICE

(71) Applicant: Japan Display Inc., Tokyo (JP)

(72) Inventor: Tomokazu Saitou, Tokyo (JP)

(73) Assignee: Japan Display Inc., Tokyo (JP)

( * ) Notice: Subject to any disclaimer, the term of this patent is extended or adjusted under 35 U.S.C. 154(b) by 296 days.

(21) Appl. No.: 14/508,331

(22) Filed: Oct. 7, 2014

(65) Prior Publication Data

US 2015/0098035 A1   Apr. 9, 2015

(30) Foreign Application Priority Data

Oct. 8, 2013   (JP) .................................. 2013-211328

(51) Int. Cl.
*G02F 1/1345*   (2006.01)

(52) U.S. Cl.
CPC ...... *G02F 1/13458* (2013.01); *G02F 1/13452* (2013.01); *H01L 2224/16225* (2013.01); *H01L 2224/32225* (2013.01); *H01L 2224/73204* (2013.01)

(58) Field of Classification Search
CPC .................................................. G02F 1/13452
USPC ........................................................ 349/151
See application file for complete search history.

(56) References Cited

U.S. PATENT DOCUMENTS

| | | | | |
|---|---|---|---|---|
| 4,832,455 A | * | 5/1989 | Takeno | G02F 1/13452 349/149 |
| 2002/0080318 A1 | * | 6/2002 | Yamate | G02F 1/1345 349/149 |
| 2006/0103000 A1 | * | 5/2006 | Kurosawa | H01L 23/49805 257/690 |
| 2010/0051330 A1 | * | 3/2010 | Yamashita | C09J 9/02 174/255 |
| 2010/0085696 A1 | * | 4/2010 | Kim | G02F 1/13452 361/679.21 |

FOREIGN PATENT DOCUMENTS

JP    2012-227480 A    11/2012

* cited by examiner

*Primary Examiner* — Thanh-Nhan P Nguyen
(74) *Attorney, Agent, or Firm* — Typha IP LLC

(57) ABSTRACT

In a display device that a terminal of a display panel is connected to bumps of the driver IC via an ACF, the driver IC includes input-side and output-side bump arrays arranged along mutually facing long sides. In configurations of the driver IC, a width A of a short side thereof ≥1.45 mm, a thickness thereof B ≤0.20 mm, a dimension C between input-side and output-side bumps ≥1.10 mm, a length D of each bump ≥98 μm, a minimum dimension F between the bumps ≤15 μm, a number of arrays G of the output-side bump ≥2 (two arrays) and a particle size E of a conductive particle contained in the anisotropic conductive film ≤3.5 μm, not more than six configurations are included.

5 Claims, 2 Drawing Sheets

DISPLAY DEVICE

CLAIM OF PRIORITY

The present application claims priority from Japanese patent application JP 2013-211328 filed on Oct. 8, 2013 the content of which is hereby incorporated by reference into this application.

BACKGROUND OF THE INVENTION

Field of the Invention
The present invention relates to a display device.
Description of the Related Art
Display devices are widely used in display units of various types of electronic equipment such as cell phones, digital cameras and so forth. A liquid crystal display device that is one type of the display device includes a liquid crystal display (LCD) panel and a driver IC with a circuit for driving and controlling the LCD panel loaded thereon.

The LCD panel has a configuration that liquid crystals are sealed between a TFT substrate (a glass substrate) with a thin film transistor (TFT) and so forth formed thereon and a CF substrate with a color filter (CF) and so forth formed thereon. In such an LCD panel, a COG (Chip On Glass) system of implementing a naked driver IC (a not-packaged IC) directly onto the TFT substrate with wiring formed thereon is adopted. As a method of implementing an IC chip in this COG system, for example, a method of using an anisotropic conductive film called an ACF (Anisotropic Conductive Film) is known. In implementation of the IC chip by using this ACF, a connection unit (an LCD terminal) configured by part of the wiring formed on the TFT substrate and a bump formed on a circuit formation surface (a main surface) of the driver IC are electrically and mechanically connected together via conductive particles in the ACF by heating and pressurizing the ACF by using a compression bonding head. As the ACF, for example, a sheet-shaped film that contains an epoxy-based thermosetting insulating resin and many conductive particles is used. The liquid crystal display device of the COG system using the ACF is described, for example, in Japanese Patent Application Laid-Open Publication No. 2012-227480.

SUMMARY OF THE INVENTION

A circuit is deposited onto one surface of the driver IC and bumps are arranged on the input and output sides of the driver IC for use in connection with the LCD terminal. In many cases, the bump is generally arranged in the vicinity of an end face on the long-side side of the driver IC. Attainment of higher definition and thinning of the display device are now being promoted. Since, in association therewith, a plurality of bumps 121a and 121b provided on the driver IC are arranged on the both ends on the long-side sides of a driver IC 120 as illustrated in FIG. 5 and the number of bumps, particularly, on the output side is increased, the bumps are arranged in two to four arrays in a zigzag form in some cases (two arrays, in an example in FIG. 5) and there is a tendency toward more reducing a distance between the adjacent bumps and more thinning the driver IC 120. Accordingly, the inventors of the present invention have examined matters to be solved in connection of the driver IC 120 to the TFT substrate in a liquid crystal display device so configured. Incidentally, 122 denotes an alignment mark.

FIG. 2 is an explanatory diagram illustrating one example of a thermo compression bonding method to be performed for connecting the driver IC 120 to the TFT substrate using the ACF. An LCD panel 100 and the driver IC 120 are arranged under a compression bonding tool 300 via an ACF 130. When the driver IC 120 is to be heated and pressurized by the compression bonding tool 300, a cushioned Teflon (a registered trademark) sheet that makes it possible to prevent adhesion of the ACF 130 to the compression bonding tool 300 and contamination of the driver IC 120 is inserted between the compression bonding tool 300 and the driver IC 120 as a buffer material 310. The buffer material (the Teflon sheet) 310 has a thickness of 0.03 mm to 0.1 mm.

Sectional diagrams taken along the a-a' line in FIG. 2 are illustrated in FIG. 3. An LCD terminal 105 is formed on a part of the TFT substrate (a glass substrate) of the LCD panel 100, a gold (Au) bump 121 is formed under the driver IC 120 and the ACF 130 that contains an ACF adhesive layer 131 and many ACF conductive particles 132 is arranged between the LCD panel 100 and the driver IC 120 (the left-side drawing in FIG. 3).

The compression boding head 301 of the compression bonding tool 300 is moved downward from the above-mentioned state via the Teflon sheet 310 (the right-side drawing in FIG. 3). Thereby, the ACF conductive particles 132 are crushed between the LCD terminal 105 and the bump 121 of the driver IC 120 and electric conduction is obtained. In addition, since the ACF adhesive layer 131 is thermoset, the ACF 130 is maintained in a state that it has been pressurized and the driver IC 120 is fixed to the LCD panel 100.

FIG. 1A illustrates one example of the external appearance of the LCD panel 100 so produced. A display area 110 occupies most of the LCD panel 100. A terminal area is formed mainly on its one side (here, an upper end part) and the driver IC 120 and an FPC (Flexible Printed Circuit) 200 are implemented in this terminal area. The bump 121 of the driver IC 120 and the LCD terminal 105 of the LCD panel 100 have been originally expected to be electrically connected with each other via the conductive particles 132 in the ACF 130. However, it was found that on the LCD panel 100, a line defect 111 that lines appear vertically or horizontally is observed as illustrated in FIG. 1B and the entire of the display screen is abnormally displayed (or hidden) 112 as illustrated in FIG. 1C in some cases, and therefore electric conduction between the LCD terminal 105 of the LDC panel 100 and the bump 121 of the driver IC 120 is not necessarily obtained in reality (opening of a connection has occurred between the LCD terminal 105 and the bump 121)

The present invention aims to provide a display device making it possible to prevent occurrence of opening of a connection between a display panel terminal and a driver IC bump even when the display panel terminal and the driver IC bump are to be connected together using an anisotropic conductive film.

In order to solve the above-mentioned disadvantages, according to one embodiment of the present invention, there is provided a display device including a display panel and a rectangular driver IC connected to the display panel via an anisotropic conductive film, wherein the driver IC includes an input-side bump array and an output-side bump array along mutually facing long sides, and in configurations listed as follows as seven items of
(1) a width A of a short side of the driver IC ≥1.45 mm,
(2) a thickness B of the driver IC ≤0.20 mm, (3) a dimension C between input-side and output-side bumps of the driver IC ≥1.10 mm, (4) a length D of each bump of the driver IC ≥98 μm, (5) a particle size E of a conductive particle contained in the anisotropic conductive film ≤3.5 μm, (6) a minimum dimension F between the bumps of the driver IC ≤15 μm and (7) a number of arrays G of the output-side bumps of the driver IC ≥2 (two arrays), not more than six configurations are included.

According to the embodiments of the present invention, it is possible to provide the display device making it possible to prevent occurrence of opening of the connection between the display panel terminal and the driver IC bump even when the display panel terminal and the driver IC bump are to be connected together using the anisotropic conductive film.

DETAILED DESCRIPTION OF THE PREFERRED EMBODIMENTS

Figure 1A:
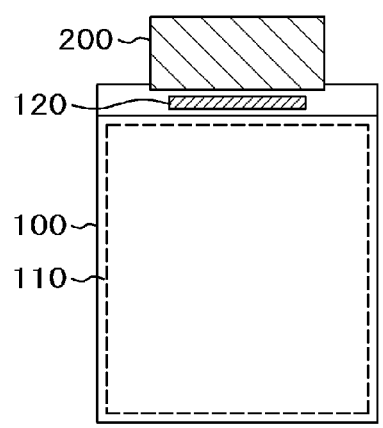
FIG. 1A is an explanatory diagram, that is, a schematic plan view illustrating one example of the external appearance of an LCD panel of a liquid crystal display device that the inventors of the present invention have examined.
Figure 1B:
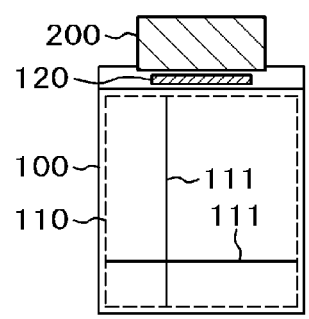
FIG. 1B is a diagram illustrating one example of a display defect occurred on the LCD panel illustrated in FIG. 1A.
Figure 1C:
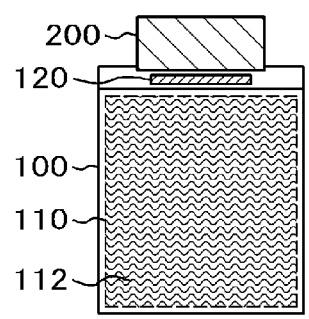
FIG. 1C is a diagram illustrating another example of the display defect occurred on the LCD panel illustrated in FIG. 1A.

The inventors of the present invention have examined a cause for occurrence of the line defect illustrated in FIG. 1B and the display abnormality over the entire of the display screen illustrated in FIG. 1C by using a configuration so made as to make the driver IC thin and so forth in anticipation of future products. As a result, it was found that the principal cause for occurrence of the display abnormality lies in opening of a connection occurred at the output-side bumps formed along the long-side sides of the driver IC, more specifically, the output-side bump in the outer-side array of two arrays.

Figure 4A:
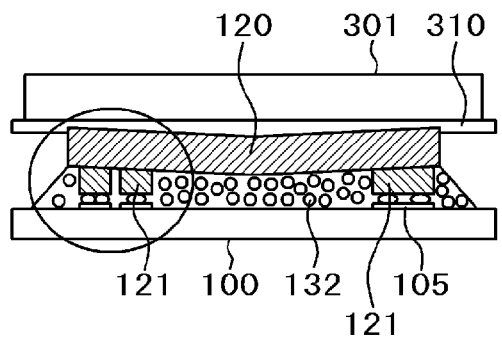
FIG. 4A is a diagram for explaining a result of the examination that the inventors have performed, that is, a main part sectional diagram illustrating one example of a state observed when the driver IC and the LCD panel have been compression-bonded together using a heating head (corresponding to the section taken along the a-a' line in FIG. 2)
Figure 4B:
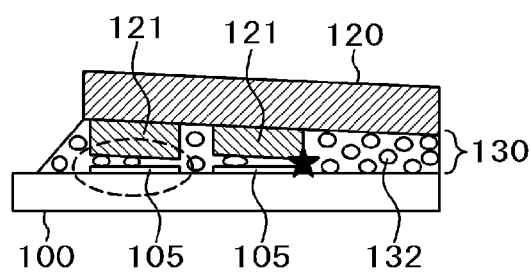
FIG. 4B is a partially enlarged diagram illustrating one example of a circled part in FIG. 4A.

Description will be made in more detail using FIG. 4A and FIG. 4B. FIG. 4A is a sectional schematic diagram illustrating one example of a state observed when the driver IC 120 and the LCD panel 100 have been compression-bonded together using the heating head (corresponding to the section taken along the a-a' line in FIG. 2). FIG. 4B is a partially enlarged diagram illustrating one example of a circled part in FIG. 4A. When a compression bonding head 301 is pressed against the driver IC 120, the way of a pressing force is blocked its way by the bumps arranged under the driver IC 120 and it runs into an area with no bumps, and thus deformation (warping) occurs on a short-side central part (the area with no bumps) of the driver IC 120. It was presumed that due to occurrence of this deformation, the bump in the outer-side array (a part circled with a broke line) floats by using an inner-side corner (a part marked with * in FIG. 4B) of the bump in the inner-side array of two arrays of output-side bumps as a fulcrum and indentation weakness has occurred. As a result of the examination that the inventors have further performed, it was found that this phenomenon has a close relationship not only with a thickness of the driver IC but also with a width of the driver IC, a dimension between the input-side and output-side bumps, a length of each bump, a particle size of the conductive particle in the ACF, a minimum inter-bump dimension and a number of arrays of the output-side bumps.

Figure 2:
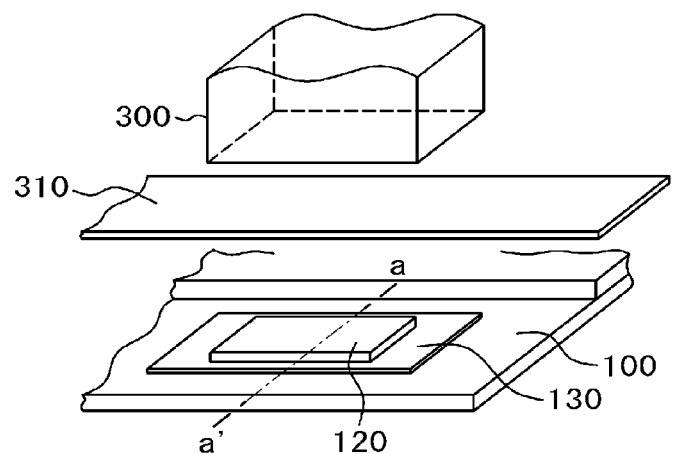
FIG. 2 is an explanatory diagram illustrating one example of a general thermo compression bonding method to be performed in order to connect a driver IC to a TFT substrate using an ACF.
Figure 3:
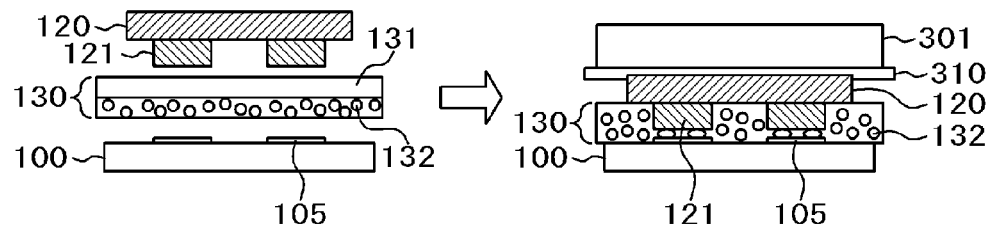
FIG. 3 is a sectional diagram taken along the a-a' line in FIG. 2, illustrating one example of a state before thermo compression bonding is performed left side), and illustrating one example of a state that the thermo compression bonding is being performed (right side)
Figure 5:
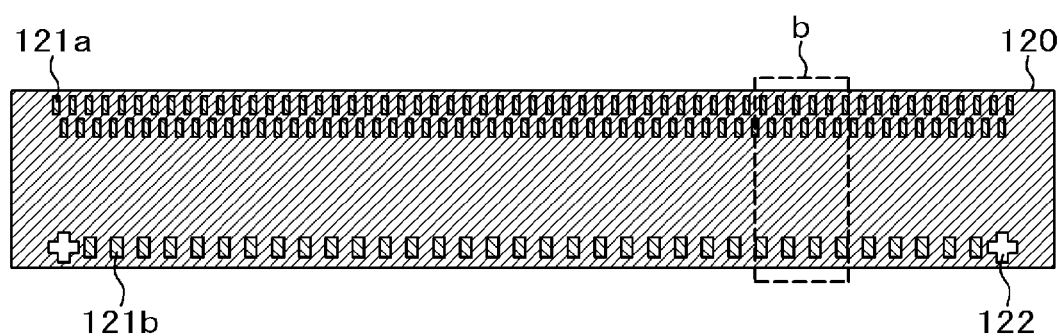
FIG. 5 is a schematic plan view illustrating one example of the driver IC of the liquid crystal display device that the inventors have examined.
Figure 6A:
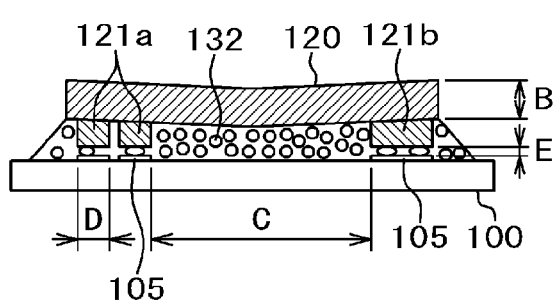
FIG. 6A is a main part schematic diagram illustrating one example of a display device according to a first embodiment of the present invention, that is, a sectional diagram illustrating one example of a part corresponding to the section taken along the a-a' line in FIG. 2.
Figure 6B:
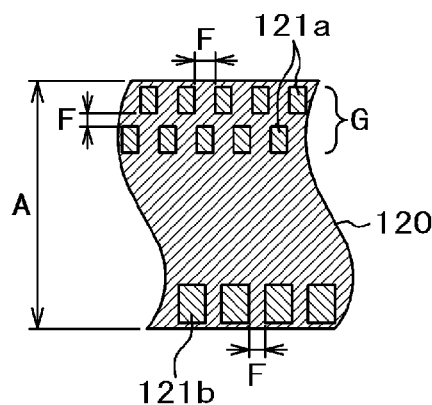
FIG. 6B is an enlarged plan view illustrating one example of an area b in FIG. 5.

FIG. 6A and FIG. 6B are diagrams for explaining the items concerned. FIG. 6A is a main part schematic diagram illustrating one example of a display device according to a first embodiment of the present invention, that is, a sectional diagram illustrating one example of a part corresponding to the section taken along the a-a' line in FIG. 2 and FIG. 6B is an enlarged plan view illustrating one example of an area b in FIG. 5. In the drawings, A denotes the width of the driver IC 120 (FIG. 6B). A boundary value of the width A for indicating whether the indentation weakness occurs is 1.45 mm and the indentation weakness is apt to occur when the value is 1.45 mm or more. B denotes the thickness of the driver IC 120. A boundary value of the thickness B is 0.20 mm and the indentation weakness is apt to occur when the value is 0.20 mm or less. C denotes the dimension between the input-side and output-side bumps, a boundary value of the dimension C is 1.10 mm and the indentation weakness is apt to occur when the value is 1.10 mm or more. D denotes the length of each bump, a boundary value of the bump length D is 98 μm and the indentation weakness is apt to occur when the value is 98 μm or more. E denotes the particle size of the ACF particle and a boundary value of the particle size E is 3.5 μm. F denotes the minimum inter-bump dimension to which the dimension between the bumps that are arranged with the narrowest space corresponds among the dimension between the input-side bumps, the dimension between the output-side bumps and the dimension between output-side bumps arrayed in a zigzag form and a boundary value is 15 μm. G denotes the number of the arrays of the output-side bumps and indicates the number of arrays when the output-side bumps are arrayed in the zigzag form. A boundary value thereof is 2 (two arrays). All of the above-mentioned data are shown in Table 1.

TABLE 1

| No | GRAPHIC SYMBOL | NAME | OUTER-SIDE BUMP INDENTATION WEAKNESS OCCURRING DIMENSION |
|---|---|---|---|
| 1 | A | DRIVER WIDTH | 1.45 mm≤ |
| 2 | B | DRIVER THICKNESS | 0.20 mm≥ |
| 3 | C | DIMENSION BETWEEN INPUT-SIDE AND OUTPUT-SIDE BUMPS | 1.10 mm≤ |
| 4 | D | BUMP LENGTH | 98 μm≤ |
| 5 | E | ACF PARTICLE SIZE | 3.5 μm≥ |
| 6 | F | MINIMUM INTER-BUMP DIMENSION | 15 μm≥ |
| 7 | G | NUMBER OF ARRAYS OF OUTPUT-SIDE BUMPS | 2 (TWO ARRAYS)≤ |

*: A tendency toward occurring the indentation weakness on the outer-side bump is observed in combination of at least four items and it reaches a not-accepted level in combination of all of the seven items.

The possibility of occurrence of the indentation weakness on the outer-side bump of the driver IC 120 is varied depending on the specification of the driver IC 120 used and the ACF particle size. The seven items that would affect occurrence of the indentation weakness will be described. According to the examination performed by the inventors, it was found that in the above table, the indentation weakness does not occur, stable electric conduction is obtained and the line defect and the abnormality over the entire of the display screen are not observed in combination of not more than three items, although the tendency toward occurring the indentation weakness is observed, the line defect and the abnormality over the entire of the display screen are not observed immediately after a product has been manufactured in combination of four to six items, and when all of the seven items have values indicating that there exists the tendency toward occurring the indentation weakness, the connection between the LCD terminal 105 and the bump 121 of the driver IC 120 is opened immediately after the product has been manufactured. A latest driver IC has a tendency toward reducing the ACF particle size in association with an increase in width, a reduction in thickness and a reduction in inter-bump dimension (coping with a narrowed pitch) and is in a situation that the phenomenon of the outer-side bump indentation weakness is more liable to occur than ever.

In the following, embodiments of the present invention will be described in more detail. Incidentally, although in the present embodiments, description will be made by giving the liquid crystal display device by way of example, the present invention is not limited to the liquid crystal display device. In addition, the same numerals denote the same constitutional elements.

[First Embodiment]

A first embodiment will be described by using Table 2.

TABLE 2

| GRAPHIC SYMBOL | NAME | OUTER-SIDE BUMP INDENTATION WEAKNESS OCCURRING DIMENSION | NOT-ACCEPTED EXAMPLE | | ACCEPTED EXAMPLE WITH PHENOMENON | | | | | ACCEPTED EXAMPLE WITHOUT PHENOMENON | | |
|---|---|---|---|---|---|---|---|---|---|---|---|---|
| | | | VARIETY 1 | VARIETY 2 | VARIETY 3 | VARIETY 4 | VARIETY 5 | VARIETY 6 | VARIETY 7 | VARIETY 8 | VARIETY 9 | VARIETY 10 |
| A | DRIVER WIDTH | 1.45 mm≤ | 1.55 | 1.72 | 1.45 | 1.58 | 1.56 | 1.36 | 1.27 | 1.00 | 0.75 | 1.10 |
| B | DRIVER THICKNESS | 0.20 mm≥ | 0.17 | 0.20 | 0.17 | 0.17 | 0.17 | 0.17 | 0.17 | 0.20 | 0.20 | 0.23 |
| C | DIMENSION BETWEEN INPUT-SIDE AND OUTPUT SIDE BUMPS | 1.10 mm≤ | 1.126 | 1.232 | 0.974 | 1.016 | 1.102 | 1.052 | 0.689 | 0.520 | 0.382 | 0.700 |
| D | BUMP LENGTH | 98 μm≤ | 98 | 110 | 100 | 96 | 90 | 100 | 100 | 70 | 90 | 90 |
| E | ACF PARTICLE SIZE | 3.5 μm≥ | 3.2 | 3.2 | 3.2 | 3.2 | 4.0 | 3.2 | 3.2 | 3.2 | 3.2 | 3.2 |
| F | MINIMUM INTER-BUMP DIMENSION | 15 μm≥ | 15 | 14 | 15 | 14 | 16 | 14 | 17 | 17 | 16 | 20 |
| G | NUMBER OF ARRAYS OF OUTPUT-SIDE BUMPS | 2 (TWO ARRAYS)≤ | 2 | 2 | 2 | 3 | 2 | 1 | 3 | 3 | 2 | 2 |

TABLE 2-continued

| GRAPHIC SYMBOL NAME | OUTER-SIDE BUMP INDENTATION WEAKNESS OCCURRING DIMENSION | NOT-ACCEPTED EXAMPLE | | ACCEPTED EXAMPLE WITH PHENOMENON | | | | | ACCEPTED EXAMPLE WITHOUT PHENOMENON | | |
|---|---|---|---|---|---|---|---|---|---|---|---|
| | | VARIETY 1 | VARIETY 2 | VARIETY 3 | VARIETY 4 | VARIETY 5 | VARIETY 6 | VARIETY 7 | VARIETY 8 | VARIETY 9 | VARIETY 10 |
| NUMBER OF OUTER-SIDE BUMP INDENTATION WEAKNESS OCCURRING DIMENSION | | 7 | 7 | 6 | 5 | 4 | 4 | 4 | 3 | 3 | 2 |

In a liquid crystal display device (Variety 3) according to the present embodiment, when the device was manufactured so as to be 1.45 mm in width of the driver IC, 0.17 mm in thickness of the driver IC, 0.974 mm in dimension between input-side and output-side bumps, 100 μm in bump length, 3.2 μm in particle size of the conductive particle in the ACF, 15 μm in minimum inter-bump dimension and 2 (two arrays) in number of output-side bump arrays (the number of outer-side bump indentation weakness occurring dimension: 6), opening of the connection caused by the indentation weakness of such an extent that the line defect and the abnormality over the entire of the display screen would occur was not confirmed. In addition, the number of outer-side bump indentation weakness occurring dimension is 6 and it is possible to obtain an image of higher.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film.

[Second Embodiment]

A second embodiment will be described by using Table 2.

In a liquid crystal display device (Variety 4) according to the present embodiment, when the device was manufactured so as to be 1.58 mm in width of the driver IC, 0.17 mm in thickness of the driver IC, 1.016 mm in dimension between input-side and output-side bumps, 96 μm in bump length, 3.2 μm in particle size of the conductive particle in the ACF, 14 μm in minimum inter-bump dimension and 2 (two arrays) in number of output-side bump arrays (the number of outer-side bump indentation weakness occurring dimension: 5), opening of the connection caused by the indentation weakness of such an extent that the line defect and the abnormality over the entire of the display screen would occur was not confirmed. In addition, the number of outer-side bump indentation weakness occurring dimension is 5 and it is possible to obtain an image of higher.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film.

[Third Embodiment]

A third embodiment of the present invention will be described by using Table 2.

In a liquid crystal display device (Variety 5) according to the present embodiment, when the device was manufactured so as to be 1.56 mm in width of the driver IC, 0.17 mm in thickness of the driver IC, 1.102 mm in dimension between input-side and output-side bumps, 90 μm in bump length, 4.0 μm in particle size of the conductive particle in the ACF, 16 μm in minimum inter-bump dimension and 2 (two arrays) in number of output-side bump arrays (the number of outer-side bump indentation weakness occurring dimension: 4), opening of the connection caused by the indentation weakness of such an extent that the line defect and the abnormality over the entire of the display screen would occur was not confirmed. In addition, the number of outer-side bump indentation weakness occurring dimension is 4 and it is possible to obtain an image of higher.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film.

[Fourth Embodiment]

A fourth embodiment of the present invention will be described by using Table 2.

In a liquid crystal display device (Variety 6) according to the present embodiment, when the device was manufactured so as to be 1.36 mm in width of the driver IC, 0.17 mm in thickness of the driver IC, 1.052 mm in dimension between input-side and output-side bumps, 100 μm in bump length, 3.2 μm in particle size of the conductive particle in the ACF, 14 μm in minimum inter-bump dimension and 1 (one array) in number of output-side bump arrays (the number of outer-side bump indentation weakness occurring dimension: 4), opening of the connection caused by the indentation weakness of such an extent that the line defect and the abnormality over the entire of the display screen would occur was not confirmed. In addition, the number of outer-side bump indentation weakness occurring dimension is 4 and it is possible to obtain an image of higher.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film.

[Fifth Embodiment]

A fifth embodiment of the present invention will be described by using Table 2.

In a liquid crystal display device (Variety 7) according to the present embodiment, when the device was manufactured so as to be 1.27 mm in width of the driver IC, 0.17 mm in thickness of the driver IC, 0.689 mm in dimension between input-side and output-side bumps, 100 μm in bump length, 3.2 μm in particle size of the conductive particle in the ACF, 17 μm in minimum inter-bump dimension and 3 (three arrays) in number of output-side bump arrays (the number of outer-side bump indentation weakness occurring dimension: 4), opening of the connection caused by the indentation weakness of such an extent that the line defect and the abnormality over the entire of the display screen would occur was not confirmed. In addition, the number of outer-side bump indentation weakness occurring dimension is 4 and it is possible to obtain an image of higher.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film.

[Sixth Embodiment]

A sixth embodiment of the present invention will be described by using Table 2.

In a liquid crystal display device (Variety 8) according to the present embodiment, when the device was manufactured so as to be 1.00 mm in width of the driver IC, 0.20 mm in thickness of the driver IC, 0.520 mm in dimension between input-side and output-side bumps, 70 μm in bump length, 3.2 μm in particle size of the conductive particle in the ACF, 17 μm in minimum inter-bump dimension and 2 (two arrays) in number of output-side bump arrays (the number of outer-side bump indentation weakness occurring dimension: 3), occurrence of opening of the connection caused by the indentation weakness was not confirmed and the line defect and the abnormality over the entire of the display screen were not observed. In addition, also long-term reliability was favorable.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film. In addition, the number of outer-side bump indentation weakness occurring dimension is three and it is possible to improve the long-term reliability.

[Seventh Embodiment]

A seventh embodiment of the present invention will be described by using Table 2.

In a liquid crystal display device (Variety 9) according to the present embodiment, when the device was manufactured so as to be 0.75 mm in width of the driver IC, 0.20 mm in thickness of the driver IC, 0.382 mm in dimension between input-side and output-side bumps, 90 μm in bump length, 3.2 μm in particle size of the conductive particle in the ACF, 16 μm in minimum inter-bump dimension and 2 (two arrays) in number of output-side bump arrays (the number of outer-side bump indentation weakness occurring dimension: 3), occurrence of opening of the connection caused by the indentation weakness was not confirmed and the line defect and the abnormality over the entire of the display screen were not observed. In addition, also the long-term reliability was favorable.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film. In addition, the number of outer-side bump indentation weakness occurring dimension is three and it is possible to improve the long-term reliability.

[Eighth Embodiment]

An eighth embodiment of the present invention will be described by using Table 2.

In a liquid crystal display device (Variety 10) according to the present embodiment, when the device was manufactured so as to be 1.10 mm in width of the driver IC, 0.23 mm in thickness of the driver IC, 0.700 mm in dimension between input-side and output-side bumps, 90 μm in bump length, 3.2 μm in particle size of the conductive particle in the ACF, 20 μm in minimum inter-bump dimension and 2 (two arrays) in number of output-side bump arrays (the number of outer-side bump indentation weakness occurring dimension: 2), occurrence of opening of the connection caused by the indentation weakness was not confirmed and the line defect and the abnormality over the entire of the display screen were not observed. In addition, also the long-term reliability was favorable. Incidentally, it is possible to obtain stable electric conduction by reducing the number of outer-side bump indentation weakness occurring dimension to zero.

According to the present embodiment, it is possible to provide the display device making it possible to prevent occurrence of opening of the connection between the display panel terminal and the driver IC bump even when the display panel terminal and the driver IC bump are to be connected together using the anisotropic conductive film. In addition, the number of outer-side bump indentation weakness occurring dimension is two and it is possible to improve the long-term reliability by reducing.

[First Comparative Example]

A first comparative example will be described by using Table 2.

In a liquid crystal display device (Variety 1) according to the present comparative example, when the device was manufactured so as to be 1.55 mm in width of the driver IC, 0.17 mm in thickness of the driver IC, 1.126 mm in dimension between input-side and output-side bumps, 98 μm in bump length, 3.2 μm in particle size of the conductive particle in the ACF, 15 μm in minimum inter-bump dimension and 2 (two arrays) in number of output-side bump arrays (the number of outer-side bump indentation weakness occurring dimension: 7), opening of the connection caused by the indentation weakness occurred and the line defect and the abnormality over the entire of the display screen occurred.

[Second Comparative Example]

A second comparative example will be described by using Table 2.

In a liquid crystal display device (Variety 2) according to the present comparative example, when the device was manufactured so as to be 1.72 mm in width of the driver IC, 0.20 mm in thickness of the driver IC, 1.232 mm in dimension between input-side and output-side bumps, 110 μm in bump length, 3.2 μm in particle size of the conductive particle in the ACF, 14 μm in minimum inter-bump dimension and 2 (two arrays) in number of output-side bump arrays (the number of outer-side bump indentation weakness occurring dimension: 7), opening of the connection caused by the indentation weakness occurred and the line defect and the abnormality over the entire of the display screen occurred.

Incidentally, although description has been made by using the liquid crystal display device in the above-mentioned embodiments, it is also possible to apply the present invention to other display devices such as an organic EL display device and so forth in addition to the liquid crystal display device. In addition, the present invention is not limited to the above-mentioned embodiments and includes various modified examples. For example, the above-mentioned embodiments have been described in detail for ready understanding of the present invention and the present invention is not necessarily limited to those including all of the configurations described above. In addition, a part of one configuration of one embodiment may be replaced with one configuration of another embodiment. Further, one configuration of another embodiment may be added to one configuration of one embodiment. Still further, another configuration may be added to, deleted from and/or replaced with a part of one configuration of each embodiment.

What is claimed is:

1. A display device, comprising:
   a display panel; and
   a rectangular driver IC connected to the display panel via an anisotropic conductive film,
   wherein the driver IC has an input-side bump array and an output-side bump array along mutually facing long sides, and
   in configurations listed as follows as seven items of
   (1) a width A of a short side of the driver IC ≥1.45 mm,
   (2) a thickness B of the driver IC ≤0.20 mm,
   (3) a dimension C between input-side and output-side bumps of the driver IC ≥1.10 mm,
   (4) a length D of each bump of the driver IC ≥98 μm,
   (5) a particle size E of a conductive particle contained in the anisotropic conductive film ≤3.5 μm,
   (6) a minimum dimension F between the bumps of the driver IC ≤15 μm and
   (7) a number of arrays G of the output-side bumps of the driver IC ≥2 (two arrays), six configurations are included and more than six configurations are not included.

2. The display device according to claim 1,
   wherein the six configurations include the configuration (2).

3. The display device according to claim 2,
   wherein the six configurations include the configuration (5).

4. The display device according to claim 3,
   wherein the six configurations include the configuration (7).

5. The display device according to claim 1,
   wherein the drive IC is of the type to be connected to the display panel in an unpackaged state.

* * * * *